US010236334B2

(12) United States Patent
Lee et al.

(10) Patent No.: US 10,236,334 B2
(45) Date of Patent: Mar. 19, 2019

(54) ORGANIC LIGHT EMITTING DIODE DISPLAY

(71) Applicant: SAMSUNG DISPLAY CO., LTD., Yongin-si, Gyeonggi-do (KR)

(72) Inventors: Min Jung Lee, Seoul (KR); Do Hyun Kwon, Seongnam-si (KR); Mi Jang, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/698,200

(22) Filed: Sep. 7, 2017

(65) Prior Publication Data

US 2018/0069191 A1    Mar. 8, 2018

(30) Foreign Application Priority Data

Sep. 7, 2016 (KR) .................. 10-2016-0115127

(51) Int. Cl.
*H01L 27/32* (2006.01)
*G06F 3/041* (2006.01)
(Continued)

(52) U.S. Cl.
CPC .......... *H01L 27/3276* (2013.01); *G06F 3/044* (2013.01); *G06F 3/0412* (2013.01);
(Continued)

(58) Field of Classification Search
CPC ... H01L 27/32; H01L 27/3213; H01L 27/323; H01L 27/324; H01L 27/326; H01L 27/3276; H01L 27/3297
See application file for complete search history.

(56) References Cited

U.S. PATENT DOCUMENTS

2015/0015530 A1*  1/2015  Kim .................. G06F 3/044
                                                345/174
2015/0364527 A1* 12/2015  Wang ................ H01L 27/3225
                                                257/40
(Continued)

FOREIGN PATENT DOCUMENTS

KR    10-2014-0070340    6/2014
KR    10-2015-0001165    1/2015
KR    10-2016-0073531    6/2016

*Primary Examiner* — Eduardo A Rodela
(74) *Attorney, Agent, or Firm* — F. Chau & Associates, LLC (57) ABSTRACT

An OLED display includes a substrate including a display area and a non-display area disposed adjacent to the display area, a pixel circuit portion disposed in the display area, and an organic light emitting diode including a first electrode connected to the pixel circuit portion and a second electrode that faces the first electrode. The OLED display further includes a common voltage portion disposed in the non-display area, connected to the second electrode, and disposed on a layer that is different from the second electrode. The OLED display further includes an encapsulation portion disposed in the display area and the non-display area and covering the organic light emitting diode, and a touch sensor disposed on the encapsulation portion. The touch sensor includes a touch portion disposed in the display area, and a connection wire disposed in the non-display area and connected to the touch portion.

20 Claims, 4 Drawing Sheets

(51) Int. Cl.
  *G09G 3/3233*  (2016.01)
  *H01L 51/52*  (2006.01)
  *G06F 3/044*  (2006.01)

(52) U.S. Cl.
  CPC .......... *G09G 3/3233* (2013.01); *H01L 27/32* (2013.01); *H01L 27/3241* (2013.01); *H01L 27/3297* (2013.01); *H01L 51/5203* (2013.01); *H01L 51/5237* (2013.01)

(56) References Cited

U.S. PATENT DOCUMENTS

| | | | |
|---|---|---|---|
| 2016/0218151 A1* | 7/2016 | Kwon | H01L 27/323 |
| 2016/0307971 A1* | 10/2016 | Jeon | H01L 27/3258 |
| 2017/0053976 A1* | 2/2017 | Oh | H01L 51/0097 |
| 2017/0271421 A1* | 9/2017 | Jinbo | H01L 27/3258 |
| 2018/0033980 A1* | 2/2018 | Park | H01L 51/0533 |
| 2018/0052552 A1* | 2/2018 | Tsai | G06F 3/0412 |
| 2018/0059869 A1* | 3/2018 | Ma | G06F 3/0418 |

* cited by examiner

ORGANIC LIGHT EMITTING DIODE DISPLAY

CROSS-REFERENCE TO RELATED APPLICATIONS

This application claims priority under 35 U.S.C. § 119 to Korean Patent Application No. 10-2016-0115127 filed on Sep. 7, 2016, the disclosure of which is incorporated by reference herein in its entirety.

TECHNICAL FIELD

The present invention relates to an organic light emitting diode (OLED) display.

DISCUSSION OF THE RELATED ART

A touch sensor is a device capable of detecting a touch by a pen or a user's finger.

A touch sensor typically includes a touch portion that includes a plurality of touch electrodes capable of detecting a touch, and a connection wire that is connected to the touch portion.

A touch sensor may be provided in an organic light emitting diode (OLED) display or a liquid crystal display (LCD) in an upper portion thereof. Disposing the touch sensor in the upper portion may reduce the manufacturing cost and thickness of the device including the display and the touch sensor.

SUMMARY

Exemplary embodiments of the present invention provide an organic light emitting diode (OLED) display in which the occurrence of deviation in signals passing through a connection wire that is connected with a touch portion is decreased.

According to an exemplary embodiment of the present invention, an OLED display includes a substrate that includes a display area and a non-display area that is adjacent to the display area, a pixel circuit portion disposed in the display area, an organic light emitting diode that includes a first electrode connected to the pixel circuit portion and a second electrode that faces the first electrode, and a common voltage portion disposed in the non-display area. The common voltage portion is connected to the second electrode, and is disposed on a layer that is different from the second electrode. The OLED display further includes an encapsulation portion disposed in the display area and the non-display area. The encapsulation portion covers the organic light emitting diode. The OLED display further includes a touch sensor disposed on the encapsulation portion. The touch sensor includes a touch portion disposed in the display area and a connection wire disposed in the non-display area and connected to the touch portion. The connection wire overlaps the common voltage portion.

In an exemplary embodiment, the connection wire includes a plurality of connection lines disposed between of an edge of the substrate and the display area. At least one connection line from among the plurality of connection lines disposed adjacent to the edge of the substrate does not overlap the common voltage portion.

In an exemplary embodiment, the OLED display further includes a driving circuit portion disposed in the non-display area and connected to the pixel circuit portion. The common voltage portion is disposed between the pixel circuit portion and the driving circuit portion.

In an exemplary embodiment, the driving circuit portion is adjacent to an edge of the substrate.

In an exemplary embodiment, the OLED display further includes a scan wire that connects the driving circuit portion and the pixel circuit portion, and a data wire that crosses the scan wire and is connected to the pixel circuit portion.

In an exemplary embodiment, the OLED display further includes an organic emission layer disposed between the first electrode and the second electrode.

In an exemplary embodiment, the connection wire does not overlap the second electrode. In an exemplary embodiment, the OLED display further includes a connection portion that directly connects the common voltage portion and the second electrode. The connection wire includes a plurality of connection lines disposed between an edge of the substrate and the display area. At least one connection line from among the plurality of connection lines disposed adjacent to the edge of the substrate does not overlap the connection portion.

In an exemplary embodiment, the connection portion is disposed on the same layer as the first electrode on the substrate.

In an exemplary embodiment, the touch sensor contacts the encapsulation portion.

In an exemplary embodiment, the encapsulation portion includes at least one organic layer.

In an exemplary embodiment, the encapsulation portion includes a portion on which the connection wire is disposed, and a thickness of the portion on which the connection wire is disposed gradually decreases from the display area toward an edge of the substrate.

In an exemplary embodiment, the connection wire includes a plurality of connection lines disposed between the edge of the substrate and the display area. One connection line from among the plurality of connection lines that is closest to the edge of the substrate is closer to an upper surface of the substrate than another connection line from among the plurality of connection lines that is closest to the display area.

In an exemplary embodiment, the one connection line does not overlap the common voltage portion.

According to an exemplary embodiment of the present invention, an OLED display includes a substrate including a display area and a non-display area disposed adjacent to the display area, an organic light emitting diode disposed in the display area and including a first electrode and a second electrode, a common voltage portion disposed in the non-display area and connected to the second electrode, and an encapsulation portion disposed in the display area and the non-display area. The encapsulation portion covers the organic light emitting diode. The OLED display further includes a touch sensor disposed on the encapsulation portion. The touch sensor includes a touch portion disposed in the display area, and a plurality of connection lines disposed in the non-display area and connected to the touch portion. One connection line from among the plurality of connection lines that is closest to an edge of the substrate is closer to an upper surface of the substrate than another connection line from among the plurality of connection lines that is closest to the display area.

In an exemplary embodiment, a surface of the encapsulation portion is curved in the non-display area.

In an exemplary embodiment, the surface of the encapsulation portion is substantially flat in the display area.

According to an exemplary embodiment of the present invention, an OLED display includes a substrate including a display area and a non-display area disposed adjacent to the display area, an organic light emitting diode disposed in the display area and including a first electrode and a second electrode, a common voltage portion disposed in the non-display area and connected to the second electrode, and an encapsulation portion disposed in the display area and the non-display area. The encapsulation portion covers the organic light emitting diode. The OLED display further includes a touch sensor disposed on the encapsulation portion. The touch sensor includes a touch portion disposed in the display area, and a connection wire disposed in the non-display area and connected to the touch portion. The connection wire does not overlap the second electrode.

In an exemplary embodiment, the connection wire includes a plurality of connection lines. One connection line from among the plurality of connection lines that is closest to an edge of the substrate is closer to an upper surface of the substrate than another connection line from among the plurality of connection lines that is closest to the display area.

In an exemplary embodiment, at least one of the connection lines overlaps the common voltage portion, and the one connection line that is closest to the edge of the substrate does not overlap the common voltage portion.

According to exemplary embodiments of the present invention, the occurrence of deviation in signals passing through the connection wire that is connected to the touch portion may be decreased in the OLED display.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Exemplary embodiments of the present invention will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art. It will be further understood that when events are described as occurring at substantially the same time, the events may occur at exactly the same time or at about the same time as would be understood by a person having ordinary skill in the art. It will be further understood that when a component or surface is described as being substantially flat, surface is exactly flat, or almost flat (e.g., within a measurement error), as would be understood by a person having ordinary skill in the art.

Hereinafter, an organic light emitting diode (OLED) display according to exemplary embodiments of the present invention will be described with reference to FIGS. 1 to 4.

Figure 1:
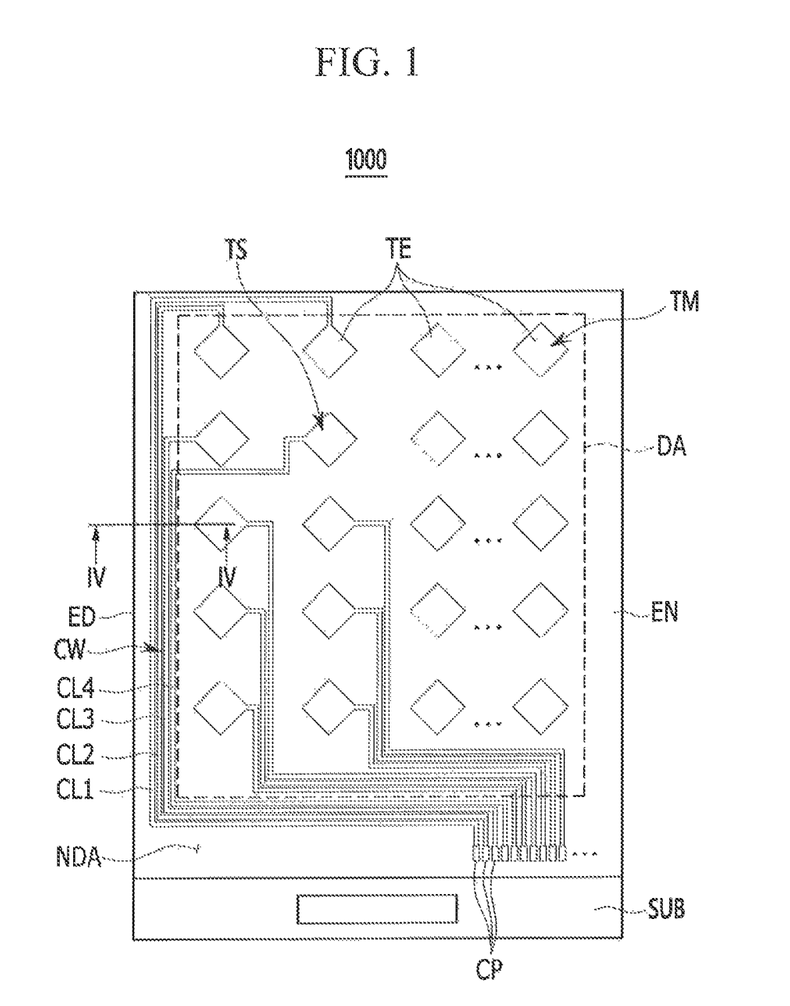
FIG. 1 is a top plan view of a substrate, an encapsulation portion, and a touch sensor of an organic light emitting diode (OLED) display according to an exemplary embodiment of the present invention.

FIG. 1 is a top plan view of a substrate, an encapsulation portion (also referred to as an encapsulation layer), and a touch sensor of an OLED display according to an exemplary embodiment. In FIG. 1, the touch sensor of the OLED display is primarily illustrated for ease of description.

Referring to FIG. 1, an OLED display 1000 according to an exemplary embodiment includes a substrate SUB, an encapsulation portion EN, and a touch sensor TS.

The substrate SUB may be flexible, and may include, for example, at least one of an organic material, an inorganic material, and glass. The substrate SUB may be stretchable, foldable, bendable, or rollable.

The substrate SUB includes a display area DA and a non-display area NDA adjacent to the display area DA. The display area corresponds to an area on a display device in which an image is displayed, and the non-display area NDA correspond to an area on the display device in which an image is not displayed.

In an exemplary embodiment, the display area DA is disposed at or near a center of the surface of the substrate SUB. However, the present invention is not limited thereto.

For example, in exemplary embodiments, the display area DA may be disposed at or near an edge portion of the surface of the substrate SUB.

In an exemplary embodiment, the non-display area NDA is disposed at or near the periphery of the display area DA and surrounds the display area DA. However, the present invention is not limited thereto. In exemplary embodiments, the non-display area NDA may surround a part of the display area DA. The non-display area NDA is disposed between the display area DA and an edge ED of the substrate SUB.

The encapsulation portion EN is disposed on the substrate SUB in the display area DA and the non-display area NDA. The encapsulation portion EN encapsulates an organic light emitting diode that is disposed between the substrate SUB and the encapsulation portion EN. The encapsulation portion EN is disposed on the display area DA and the non-display area NDA, with the organic light emitting diode interposed therebetween. The encapsulation portion EN may include at least one organic layer and at least one inorganic layer. For example, the encapsulation portion EN may include at least one organic layer and at least one inorganic layer that are alternately stacked. The encapsulation portion EN may include a plurality of inorganic layers and a plurality of organic layers, and the plurality of inorganic layers and the plurality of organic layers may be alternately stacked. Alternatively, the encapsulation portion EN may include a sandwich structure in which at least one organic layer is disposed between at least two inorganic layers.

The touch sensor TS is disposed on the encapsulation portion EN. In an exemplary embodiment, the touch sensor TS may be directly formed on the surface of the encapsulation portion EN. For example, in an exemplary embodiment, the touch sensor TS may contact the encapsulation portion EN.

According to an exemplary embodiment, the touch sensor TS may be attached to the encapsulation portion EN in the form of a film or a panel. For example, in an exemplary embodiment, the touch sensor TS may be one of a plurality of touch sensors TS that is formed in a film or panel that is attached to the encapsulation portion EN.

The touch sensor TS includes a touch portion TM, a connection wire CW, and a connection pad CP.

The touch portion TM is disposed on the encapsulation portion EN in the display area DA of the substrate SUB. The touch portion TM includes a plurality of touch electrodes TE. The touch electrodes TE are spaced apart from one another on the encapsulation portion EN in the display area DA of the substrate SUB. In an exemplary embodiment, the plurality of touch electrodes TE are arranged in a matrix form on the encapsulation portion in the display area DA. However, the present invention is not limited thereto. For example, in exemplary embodiments, the plurality of touch electrodes TE may be arranged in an irregular form rather than a matrix form on the encapsulation portion EN. The touch electrodes TE are disposed on the same layer on the encapsulation portion EN (e.g., the touch electrodes contact the same layer on the encapsulation portion EN). The touch electrodes TE may be formed, for example, from one plate form using a macro-electromechanical system (MEMS) process such as a photolithography process.

According to an exemplary embodiment, the plurality of touch electrodes TE may be connected to one another along directions that cross each other using, for example, a bridge.

According to an exemplary embodiment, the plurality of touch electrodes TE may be disposed on different layers on the encapsulation portion EN.

In an exemplary embodiment, the touch portion TM includes the plurality of touch electrodes TE formed as a single layer, as shown in FIG. 1. However, the present invention is not limited thereto. The touch portion TM may have various structures capable of detecting a touch.

In an exemplary embodiment, each of the plurality of touch electrodes TE has a shape of a rhombus in a plan view. However, the present invention is not limited thereto. For example, in exemplary embodiments, each of the plurality of touch electrodes TE may have a shape of polygons such as a triangle, a square, a pentagon, a hexagon, a heptagon, and an octagon, or a circular shape, an elliptical shape, or a closed loop shape.

The plurality of touch electrodes TE may include at least one transparent conductive material such as, for example, silver nanowire (AgNW), indium tin oxide (ITO), and indium zinc oxide (IZO).

The connection wire CW is disposed on the encapsulation portion EN in the non-display area NDA of the substrate SUB. The connection wire CW is connected to the touch portion TM. The connection wire CW is disposed between the touch portion TM and the corresponding connection pad CP, and connects the touch portion TM and the connection pad CP. The connection wire CW includes a plurality of connection lines CL1, CL2, CL3, and CL4 that is connected to the plurality of touch electrodes TE. The plurality of connection lines CL1, CL2, CL3, and CL4 is disposed between the plurality of touch electrodes TE and the plurality of connection pads CP, and connects the plurality of touch electrodes TE and the plurality of connection pads CP. The plurality of connection lines CL1, CL2, CL3, and CL4 is disposed between the edge ED of the substrate SUB and the display area DA on the encapsulation portion EN.

In FIG. 1, four connection lines CL1, CL2, CL3, and CL4 are illustrated for ease of description. However, the present invention is not limited thereto. For example, in exemplary embodiments, two, three, five, or more than five connection lines may be disposed between the edge ED of the substrate SUB and the display area DA.

The connection wire CW may include at least one conductive material from among, for example, copper (Cu), molybdenum (Mo), silver (Ag), gold (Au), aluminum (Al), silver nanowire (AgNW), indium tin oxide (ITO), and indium zinc oxide (IZO).

The connection pad CP is one of a plurality of connection pads CP. The plurality of connection pads CP is disposed on the encapsulation portion EN in the non-display area NDA of the substrate SUB. The plurality of connection pads CP is connected to the touch portion TM through the connection wire CW. The connection pads CP are spaced apart from one another. The plurality of connection pads CP may be connected to a touch controller through a connection member such as, for example, a flexible printed circuit board or a printed circuit board.

Hereinafter, constituent elements that are disposed between the substrate SUB and the encapsulation portion EN of the OLED display 1000 will be described with reference to FIGS. 2 and 3.

Figure 2:
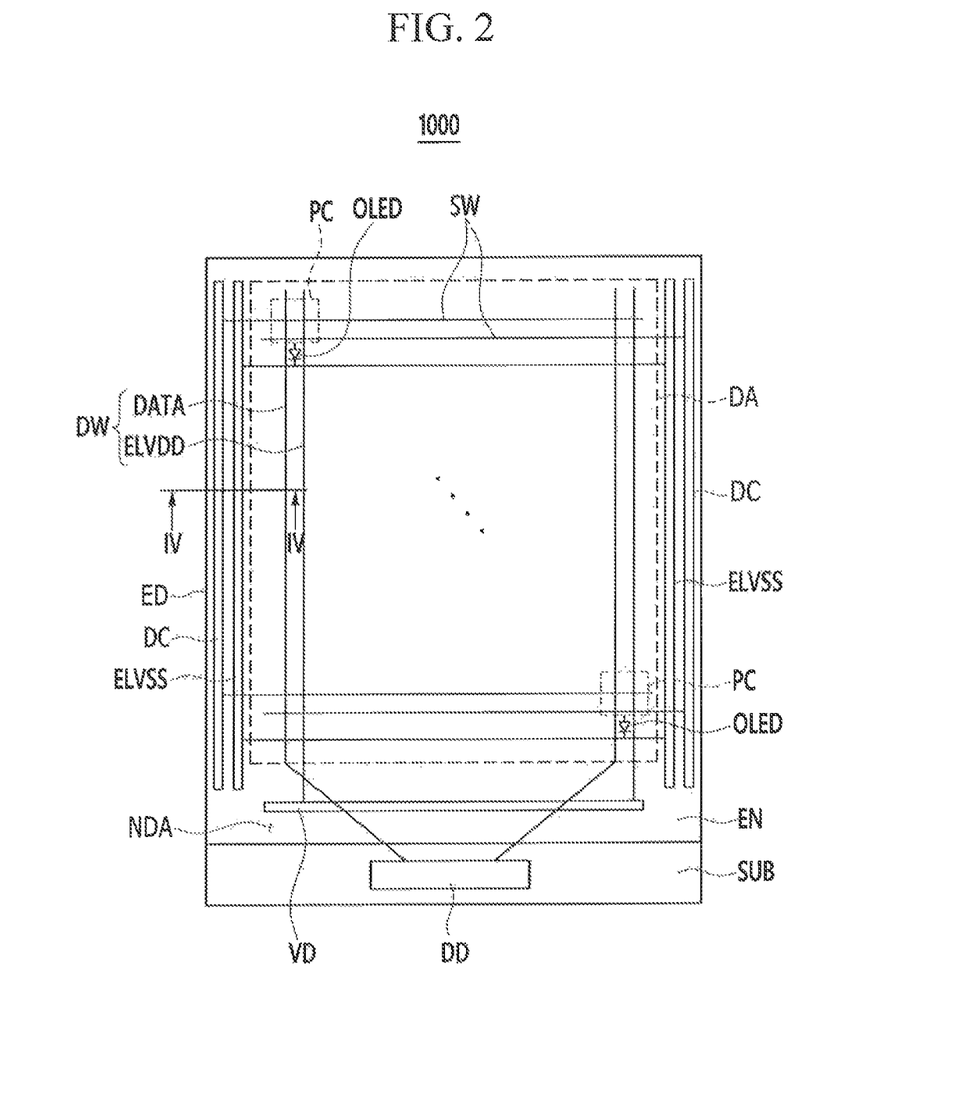
FIG. 2 is a top plan view of the substrate, the encapsulation portion, a driving circuit, a scan wire, a data driver, a driving voltage portion, a data wire, a common voltage portion, a pixel circuit, and an organic light emitting diode of the OLED display of FIG. 1 according to an exemplary embodiment of the present invention.

FIG. 2 is a top plan view of the substrate, the encapsulation portion, a driving circuit, a scan wire, a data driver, a driving voltage portion, a data wire, a common voltage portion, a pixel circuit portion, and an OLED included in the OLED display shown in FIG. 1. In FIG. 2, for ease of description, the pixel circuit portion of the OLED display is primarily illustrated and the touch sensor shown in FIG. 1 is not illustrated.

Referring to FIG. 2, the OLED display 1000 according to an exemplary embodiment includes a driving circuit portion DC, a scan wire SW, a data driver DD, a driving voltage portion VD, a data wire DW, a common voltage portion ELVSS, a pixel circuit portion PC, and an organic light emitting element (OLED). The driving circuit portion DC, the scan wire SW, the driving voltage portion VD, the data wire DW, the common voltage portion ELVSS, the pixel circuit portion PC, and the OLED are disposed between the substrate SUB and the encapsulation portion EN. The driving circuit portion DC, the data driver DD, the driving voltage portion VD, and the common voltage portion ELVSS may be connected to a controller through a connection member such as, for example, a flexible printed circuit board or a printed circuit board.

The driving circuit portion DC is disposed in the non-display area NDA of the substrate SUB. The driving circuit portion DC is connected to the pixel circuit portion PC through the scan wire SW. The driving circuit portion DC includes a plurality of driving lines and a plurality of driving thin film transistors that are connected to the plurality of driving lines. The driving circuit portion DC may have various structures. In an exemplary embodiment, the driving circuit portion DC may be provided as two driving circuit portions DC. The two driving circuit portions DC may be spaced apart from each other with the display area DA interposed therebetween. For example, the two driving circuit portions DC may be disposed on opposite sides of the display area DA. The driving circuit portion DC is adjacent to the edge ED of the substrate SUB.

The scan wire SW is disposed between the driving circuit portion DC and the pixel circuit portion PC, and connects the driving circuit portion DC and the pixel circuit portion PC. The scan wire SW may include, for example, a scan line, a previous scan line, a light emission control line, a bypass control line, and an initialization voltage line. However, the scan wire is not limited thereto.

The data driver DD is disposed in the non-display area NDA of the substrate SUB. The data driver DD is connected to the pixel circuit portion PC through a data line DATA. The data driver DD may be, for example, a chip. However, the data driver DD is not limited thereto.

The driving voltage portion VD is disposed in the non-display area NDA of the substrate SUB. In exemplary embodiments, the driving voltage portion VD is disposed between the pixel circuit portion PC and the data driver DD. However, the present invention is not limited thereto. The driving voltage portion VD is connected to the pixel circuit portion PC through a driving voltage line ELVDD.

The data wire DW crosses the scan wire SW and is connected to the pixel circuit portion PC. The data wire DW includes the data line DATA and the driving voltage line ELVDD.

The common voltage portion ELVSS is disposed in the non-display area NDA of the substrate SUB. The common voltage portion ELVSS is disposed between the driving circuit portion DC and the pixel circuit portion PC. The common voltage portion ELVSS is connected to the organic light emitting diode OLED. The common voltage portion ELVSS may include two portions that face each other, with the display area DA interposed therebetween. For example, the common voltage portion ELVSS may include two portions disposed on opposite sides of the display area DA. The two portions of the common voltage portion ELVSS may be connected to each other to form a single common voltage portion ELVSS. The two portions of the common voltage portion ELVSS may be connected to each other, for example, above the substrate SUB.

The pixel circuit portion PC is disposed in the display area DA of the substrate SUB. The pixel circuit portion PC is one of a plurality of pixel circuit portions PC. The plurality of pixel circuit portions PC may be arranged in a matrix form. The pixel circuit portion PC is connected to the scan wire SW and the data wire DW, and is thus connected to the organic light emitting element OLED. A signal that passes through the scan wire SW and the data wire DW is transmitted as a driving current to the organic light emitting diode OLED through the pixel circuit portion PC.

Figure 3:
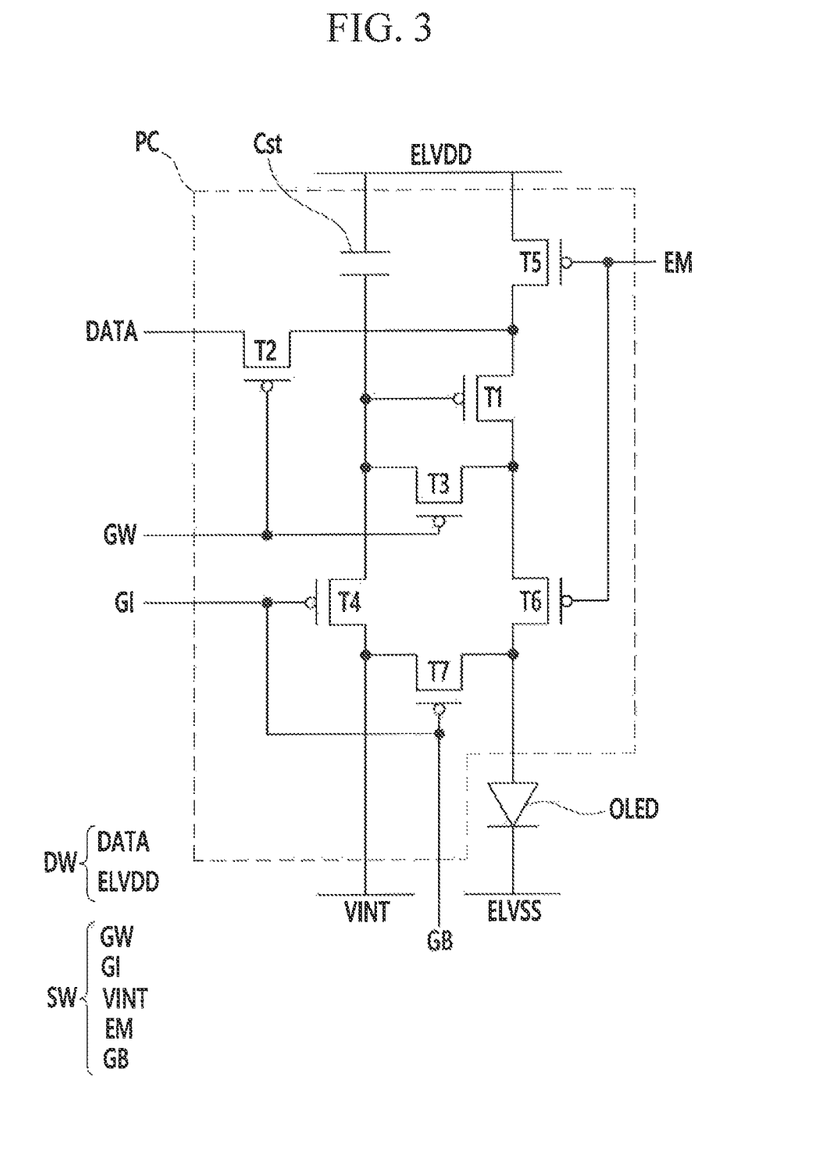
FIG. 3 is an equivalent circuit diagram of the pixel circuit shown in FIG. 2 according to an exemplary embodiment of the present invention.

FIG. 3 is an equivalent circuit diagram of the pixel circuit portion shown in FIG. 2 according to an exemplary embodiment of the present invention.

In FIG. 3, a scan line GW, a previous scan line GI, a light emission control line EM, a bypass control line GB, and an initial voltage line VINT are included in the scan wire SW, and the data line DATA and the driving voltage line ELVDD are included in the data wire DW. The pixel circuit portion PC is connected to the scan wire SW, the data wire DW, and the organic light emitting diode OLED.

Referring to FIG. 3, the pixel circuit portion PC includes a first transistor T1, a second transistor T2, a third transistor T3, a fourth transistor T4, a fifth transistor 15, a sixth transistor 16, a seventh transistor T7, and a capacitor Cst.

In an exemplary embodiment, the first transistor T1 is a driving transistor, the second transistor T2 is a switching transistor, the third transistor T3 is a compensation transistor, the fourth transistor T4 is an initialization transistor, the fifth transistor T5 is an operation control transistor, the sixth transistor T6 is a light emission control transistor, and the seventh transistor T7 is a bypass transistor.

The scan line GW transmits a scan signal to the switching transistor T2 and the compensation transistor T3, the previous scan line GI transmits a previous scan signal to the initialization transistor T4, and the light emission control line EM transmits a light emission control signal to the operation control transistor T5. In addition, the bypass control line GB is connected to the previous scan line GI, and thus, the bypass control line GB transmits the previous scan signal to the bypass transistor T7.

The data line DATA crosses the scan line GW and transmits a data signal to the switching transistor T2. The driving voltage line ELVDD is substantially parallel with the data line DATA and transmits a driving voltage to the driving transistor T1 through the operation control transistor T5. The initial voltage line VINT transmits an initialization voltage for initializing the diving transistor T1.

The scan line GW, the previous scan line GI, the light emission control line EM, the bypass control line GB, the data line DATA, the driving voltage line ELVDD, and the initial voltage line VINT are respectively connected to a single pixel circuit portion PC. Each of the plurality of pixel circuit portions PC is connected to a corresponding scan line GW, a corresponding previous scan line GI, a corresponding light emission control line EM, a corresponding bypass control line GB, a corresponding data line DATA, a corresponding driving voltage line ELVDD, and a corresponding initial voltage line VINT.

A gate electrode of the driving transistor T1 is connected to one end of the capacitor Cst, a source electrode of the driving transistor T1 is connected to the light emission control transistor T6 via the operation control transistor T5, and a drain electrode of the driving transistor T1 is connected to an anode of the organic light emitting diode OLED via the light emission control transistor T6. The driving transistor T1 receives a data signal according to a switching operation of the switching transistor T2 and supplies a driving current to the organic light emitting diode OLED.

A gate electrode of the switching transistor T2 is connected to the scan line GW, a source electrode of the switching transistor T2 is connected to the data line DATA, and a drain electrode of the switching transistor T2 is connected to the source electrode of the driving transistor T1 and the driving voltage line ELVDD via the operation control transistor T5. The switching transistor T2 is turned on according to a scan signal received through the scan line GW, and performs a switching operation for transmission of a data signal transmitted through the data line DATA to the source electrode of the driving transistor T1.

A gate electrode of the compensation transistor T3 is connected to the scan line GW, a source electrode of the compensation transistor T3 is connected to the drain electrode of the driving transistor T1 and the anode of the organic light emitting diode OLED via the light emission control transistor T6, and a drain electrode of the compensation transistor T3 is connected to one end of the capacitor Cst and the gate electrode of the driving transistor T1. The compensation transistor T3 is turned on according to a scan signal received through the scan line GW, and connects the gate electrode and the drain electrode of the driving transistor T1 to each other for diode-coupling.

A gate electrode of the initialization transistor T4 is connected to the previous scan line GI, a source electrode of the initialization transistor T4 is connected to the initialization voltage line VINT, and a drain electrode of the initialization transistor T4 is connected to one end of the capacitor Cst and the gate electrode of the driving transistor T1. The initialization transistor T4 is turned on according to a previous scan signal received through the previous scan line GI, and transmits an initialization voltage to the gate electrode of the driving transistor T1 to perform an initialization operation for initialization of the gate voltage of the gate electrode of the driving transistor T1.

The compensation transistor T3 and the initialization transistor T4 may be, for example, transistors having a dual gate structure. As a result, a leakage current may be prevented or reduced.

A gate electrode of the operation control transistor T5 is connected to the light emission control line EM, a source electrode of the operation control transistor 15 is connected to the driving voltage line ELVDD, and a drain electrode of the operation control transistor T5 is connected to the source electrode of the driving transistor T1 and the drain electrode of the switching transistor T2.

A gate electrode of the light emission control transistor T6 is connected to the light emission control line EM, a source electrode of the light emission control transistor T6 is connected to the drain electrode of the driving transistor T1 and the source electrode of the compensation transistor T3, and a drain electrode of the light emission control transistor T6 is connected to the anode of the organic light emitting diode OLED. The operation control transistor T5 and the light emission control transistor T6 are substantially simultaneously turned on according to the light emission control signal received through the light emission control line EM. As a result, the driving voltage transmitted from the driving voltage line ELVDD is compensated through the diode-coupled driving transistor T1 and then transmitted to the organic light emitting diode OLED.

A gate electrode of the bypass transistor T7 is connected to the bypass control line GB, a source electrode of the bypass transistor T7 is connected to the drain electrode of the light emission control transistor T6 and the anode of the organic light emitting diode, and a drain electrode of the bypass transistor T7 is connected to the initialization voltage line VINT and the source electrode of the initialization transistor T4. Thus, when a black image is displayed, a light emission current of the organic light emitting diode OLED, which is reduced by the amount of a bypass current flowing out from the anode of the organic light emitting diode OLED through the bypass transistor T7, has a minimum current amount at a level that can reliably display a black image. Accordingly, an accurate black luminance image can be realized by using the bypass transistor T7, and the contrast ratio may be improved.

An end of the capacitor Cst is connected to the driving voltage line ELVDD.

The pixel current portion PC is connected to the organic light emitting diode OLED.

The anode of the organic light emitting diode OLED is connected to the pixel circuit portion PC, and thus, receives a driving current from the pixel circuit portion PC. A cathode of the organic light emitting diode OLED is connected to the common voltage portion ELVSS that transmits a common voltage.

Although the pixel circuit portion PC illustrated in FIG. 3 includes seven transistors and one capacitor, the present invention is not limited thereto. For example, in exemplary embodiments, the number of transistors and the number of capacitors may be variously modified.

Hereinafter, a positional relationship between constituent elements included in the OLED display of the above-described exemplary embodiment will be described with reference to FIG. 4.

Figure 4:
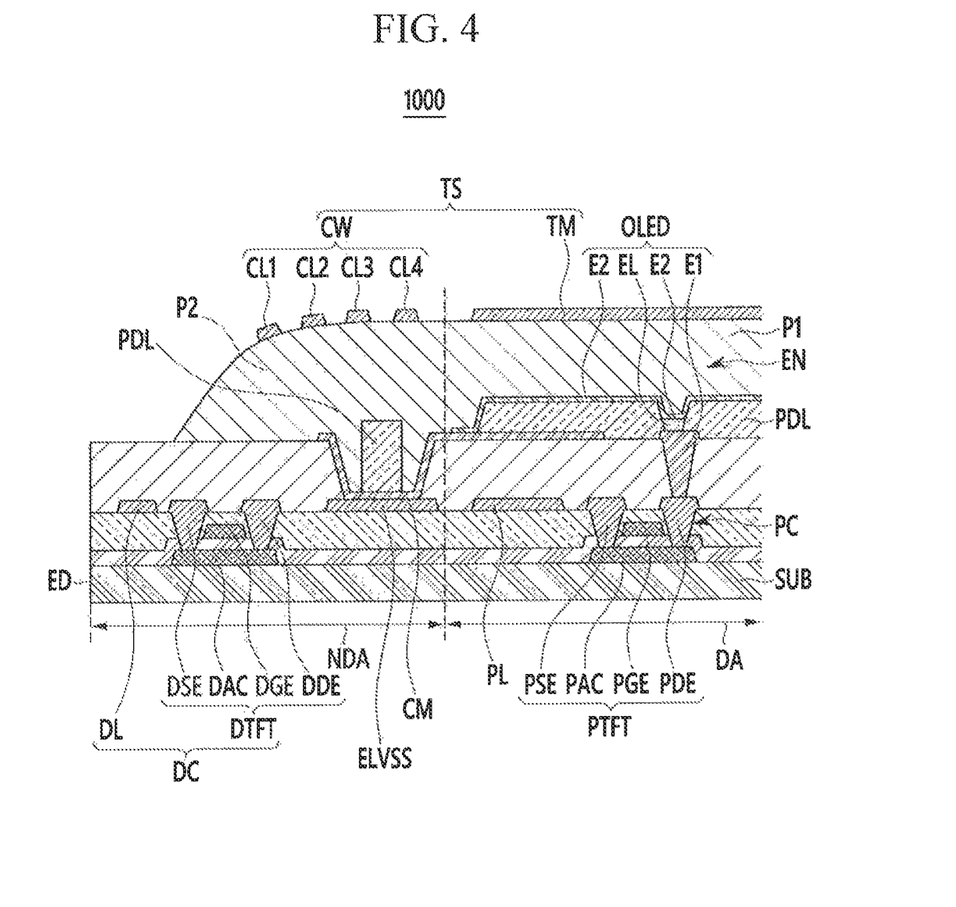
FIG. 4 is a cross-sectional view of FIGS. 1 and 2 taken along line IV-IV according to an exemplary embodiment of the present invention.

FIG. 4 is a cross-sectional view of FIGS. 1 and 2 taken along line IV-IV according to an exemplary embodiment of the present invention.

Referring to FIG. 4, the pixel circuit portion PC, the organic light emitting diode OLED, a first portion P1 of the encapsulation portion EN, and the touch portion TM of the touch sensor TS are located in the display area DA of the substrate SUB. A pixel line PL is disposed in the display area DA. The pixel line PL may be one of the scan line GW, the previous scan line GI, the light emission control line EM, the bypass control line GB, the initial voltage line VINT, the data line DATA, and the driving voltage line ELVDD.

The pixel circuit portion PC includes one of the above-described first to seventh transistors. A pixel thin film transistor PTFT includes a pixel active layer PAC, a pixel gate electrode PGE, a pixel source electrode PSE, and a pixel drain electrode PDE stacked on the substrate SUB. The pixel drain electrode PDE is connected to the first electrode E1, which is the anode of the organic light emitting diode OLED.

The pixel line PL may be disposed in the same layer as at least one of the pixel active layer PAC, the pixel gate electrode PGE, the pixel source electrode PSE, and the pixel drain electrode PED of the pixel thin film transistor PTFT.

The organic light emitting diode OLED includes the first electrode E1, an organic emission layer EL, and a second electrode E2.

The first electrode E1 may be an anode and is connected to the pixel circuit portion PC. The first electrode E1 is connected to the pixel thin film transistor PTFT of the pixel circuit portion PC. A light emission area of the first electrode E1 may be defined by a pixel defining layer PDL.

The organic emission layer EL is disposed between the first electrode E1 and the second electrode E2. The organic emission layer EL is disposed on the first electrode E1 in the light emission area defined by the pixel defining layer PDL.

The second electrode E2 may be a cathode and is connected to the common voltage portion ELVSS. The second electrode E2 may have a single plate form, and may be disposed throughout the display area DA of the substrate SUB. The OLED display 1000 further includes a connection portion CM disposed between and connecting the common voltage portion ELVSS and the second electrode E2. For example, the second electrode E2 is connected to the common voltage portion ELVSS through the connection portion CM. In an exemplary embodiment, the common voltage portion ELVSS is connected to the second electrode E2 and is disposed on a layer that is different from the second electrode E2.

The connection portion CM is disposed on the same layer (e.g., directly disposed on and contacting the same layer) as the first electrode E1 of the organic light emitting diode OLED, and directly connects the common voltage portion ELVSS and the second electrode E2. For example, in an exemplary embodiment, the connection portion CM directly contacts each of the common voltage portion ELVSS and the second electrode E2. The connection portion CM extends to the non-display area NDA from the display area DA. For example, the connection portion CM is disposed in both the display area DA and the non-display area NDA.

According to an exemplary embodiment, the second electrode E2 extends to the non-display area NDA from the display area DA, and thus, may be directly connected to the common voltage portion ELVSS (e.g., may contact the common voltage portion ELVSS). For example, in an exemplary embodiment, the second electrode E2 is disposed in both the non-display area and the display area DA, and the second electrode E2 contacts the common voltage portion ELVSS in the non-display area. In an exemplary embodiment, the second electrode E2 is disposed in the display area DA and is not disposed in the non-display area NDA.

The first portion P1 of the encapsulation portion EN is disposed on the organic light emitting diode OLED in the display area DA. The first portion P1 of the encapsulation portion EN may have a substantially flat surface. The encapsulation portion EN may include at least one organic layer and at least one inorganic layer. For example, the encapsulation portion EN may include a plurality of organic layers and a plurality of inorganic layers that are alternately stacked.

The touch portion TM is disposed on the organic light emitting diode OLED, and the encapsulation portion EN is disposed between the touch portion TM and the organic light emitting diode OLED. The touch portion TM may be disposed on (e.g., directly on) the surface of the first portion P1 of the encapsulation portion EN. For example, the touch portion TM contacts the encapsulation portion EN.

The common voltage portion ELVSS, the driving circuit portion DC, a second portion P2 of the encapsulation portion EN (e.g., a portion of the encapsulation portion EN other than the first portion P1), and the connection wire CW of the touch sensor TS are disposed in the non-display area NDA of the substrate SUB.

In an exemplary embodiment, the common voltage portion ELVSS is disposed in the non-display area NDA, and is disposed between the driving circuit portion DC and the pixel circuit portion PC. The common voltage portion ELVSS may be disposed in the same layer as one of the pixel gate electrode PGE, the pixel source electrode PSE, and the pixel drain electrode PDE of the pixel thin film transistor PTFT of the pixel circuit portion PC. In an exemplary embodiment, the common voltage portion ELVSS is connected to the second electrode E2 of the organic light emitting diode OLED through the connection portion CM. In an exemplary embodiment, the common voltage portion ELVSS is directly connected to the second electrode E2. The common voltage portion ELVSS overlaps the connection wire CW.

In an exemplary embodiment, the common voltage portion ELVSS does not overlap at least one connection line of the connection wire CW. For example, in an exemplary embodiment, the common voltage portion ELVSS does not overlap at least the connection line CL1 adjacent to the edge ED of the substrate SUB from among the plurality of connection lines CL1, CL2, CL3, and CL4 that are included in the connection wire CW. That is, in an exemplary embodiment, a connection line CL1 from among the plurality of connection lines CL1, CL2, CL3, and CL4 that is closest to the edge ED of the substrate SUB does not overlap the common voltage portion ELVSS.

In an exemplary embodiment, the pixel defining layer PDL may be partially disposed on the common voltage portion ELVSS. For example, the pixel defining layer PDL may be disposed on a portion of the common voltage portion ELVSS, and not on the entirety of the common voltage portion ELVSS. However, the present invention is not limited thereto. In an exemplary embodiment, the pixel defining layer PDL is not partially disposed on the common voltage portion ELVSS.

The driving circuit portion DC is adjacent to the edge ED of the substrate SUB. The driving circuit portion DC includes at least one driving thin film transistor DTFT and at least one driving line DL.

The driving thin film transistor DTFT includes a driving active layer DAC, a driving gate electrode DGE, a driving source electrode DSE, and a driving drain electrode DDE. The driving gate electrode DGE, the driving source electrode DSE, and the driving drain electrode DDE may be respectively connected to the driving line DL.

The second portion P2, which is a part of the encapsulation portion EN, is disposed on the common voltage portion ELVSS and the driving circuit portion DC in the non-display area NDA. The second portion P2 of the encapsulation portion EN extends from the first portion P1 of the encapsulation portion EN. The second portion P2 of the encapsulation portion EN may have a thickness that gradually decreases toward a direction of the edge ED of the substrate SUB. For example, the thickness of the second portion P2 of the encapsulation portion EN may be greatest in a first area at which the second portion P2 meets the first portion, smallest in a second area closest to the edge ED of the substrate SUB, and may decrease gradually from the first area to the second area. The second portion P2 of the encapsulation portion EN may have a curved surface, unlike the first portion P1, which may have a substantially flat surface.

As previously described, the encapsulation portion EN includes at least one organic layer and at least one inorganic layer. In this case, in an exemplary embodiment, the organic layer is formed first and then the inorganic layer may be formed on the organic layer during a manufacturing process of the encapsulation portion EN. When the inorganic layer is formed, the organic layer may be reflowed due to heat applied to the organic layer. Accordingly, an end portion of the organic layer may have a curved surface. Thus, the end portion of the organic layer (e.g., the second portion P2 of the encapsulation portion EN) in the non-display area NDA may have a curved surface.

Unlike the exemplary embodiment shown in FIG. 4, in an exemplary embodiment, the second portion P2 of the encapsulation portion EN may have a substantially flat surface.

The connection wire CW is connected to the touch portion TM, and is disposed on the common voltage portion ELVSS, interposing the encapsulation portion EN therebetween. In an exemplary embodiment, the connection wire CW is disposed on the surface of the second portion P2 of the encapsulation EN and contacts the encapsulation portion EN (e.g., the connection wire CW is disposed directly on the second portion P2 of the encapsulation portion EN).

The connection wire CW does not overlap the second electrode E2 of the organic light emitting diode OLED that is disposed in the display area DA.

The connection wire CW includes the plurality of connection lines CL1, CL2, CL3, and CL4.

The plurality of connection lines CL1, CL2, CL3, and CL4 is disposed on the second portion P2 of the encapsulation portion EN between the edge ED of the substrate SUB and the display area DA. Since the thickness of the second portion P2 of the encapsulation portion EN gradually decreases from the display area DA toward the edge ED of the substrate SUB, one connection line CL1 that is adjacent to the edge (e.g., a side surface) of the substrate SUB from among the plurality of connection lines CL1, CL2, CL3, and CL4 is disposed closer to an upper surface of the substrate SUB compared to the other connection line C4 that is disposed closest to the display area DA. In an exemplary embodiment, connection line CL1 is closer to the upper surface of the substrate SUB than connection line CL2, connection line CL2 is closer to the upper surface of the substrate SUB than connection line CL3, etc. In an exemplary embodiment, connection line CL1, which from among the plurality of connection lines CL1, CL2, CL3, and CL4 is disposed closest to the edge ED of the substrate SUB, is disposed closer to the upper surface of the substrate SUB than connection line CL4, which from among the plurality of connection lines CL1, CL2, CL3, and CL4 is disposed closest to the display area DA (and furthest from the edge ED of the substrate SUB).

At least one connection line CL1 that is adjacent to the edge ED of the substrate SUB from among the plurality of connection lines CL1, CL2, CL3, and CL4 does not overlap the common voltage portion ELVSS. In an exemplary embodiment, additional connection lines adjacent to the connection line CL1 may also not overlap the common voltage portion. ELVSS.

In addition, at least one connection line CL1 that is adjacent to the edge ED of the substrate SUB from among the plurality of connection lines CL1, CL2, CL3, and CL4 does not overlap the connection portion CM that connects the common voltage portion ELVSS and the second electrode E2. In an exemplary embodiment, additional connection lines adjacent to the connection line CL1 may also not overlap the connection portion CM.

In an exemplary embodiment, in the OLED display 1000, the connection wire CW of the touch sensor TS disposed in the non-display area NDA overlaps the common voltage portion ELVSS, and the connection wire CW does not overlap the second electrode E2 of the organic light emitting diode OLED that is connected to the common voltage portion ELVSS. Thus, although the distance between the touch sensor TS that contacts the surface of the encapsulation portion EN and the second electrode E2 may be small, generation of parasitic capacitance between the second electrode E2 and the connection wire CW may be decreased, thereby decreasing generation of deviation in a signal that passes through the connection wire CW that is connected to the touch portion TM.

In addition, in an exemplary embodiment, since the encapsulation portion EN includes the organic layer, the thickness of the second portion P2 of the encapsulation portion EN in the non-display area NDA gradually decreases from the display area DA toward the edge ED of the substrate SUB due to a characteristic of an organic material. Thus, the connection line CL1 that is adjacent to the edge ED of the substrate SUB from among the plurality of connection lines CL1, CL2, CL3, and CL4 that is included in the connection wire CW is disposed closer to the upper surface of the substrate SUB compared to the other connection line CL4 that is disposed closer to the display area DA. However, since the connection line CL1 that is adjacent to the edge ED of the substrate SUB does not overlap the common voltage portion ELVSS in the OLED display 1000, the generation of parasitic capacitance between the connection line CL1 and the common voltage ELVSS may be decreased even though the distance between the connection line CL1 and the common voltage portion ELVSS is small. As a result, the generation of deviation in the signal that passes through the connection wire CW that is connected to the touch portion TM may be decreased.

Further, in the OLED display 1000 of an exemplary embodiment, the connection line CL1 that is adjacent to the edge ED of the substrate SUB does not overlap the connection portion CM that connects the common voltage portion ELVES and the second electrode E2. Thus, generation of parasitic capacitance between the connection portion CM and the connection line CL1 may be decreased even though the distance between the connection portion CM and the connection line CL1 may be small. As a result, the generation of deviation in the signal that passes through the connection wire CW that is connected to the touch portion TM may be decreased.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. An organic light emitting diode (OLED) display, comprising:
 a substrate comprising a display area and a non-display area disposed adjacent to the display area;
 a pixel circuit portion disposed in the display area;
 an organic light emitting diode comprising a first electrode connected to the pixel circuit portion, and a second electrode that faces the first electrode;
 a common voltage portion disposed in the non-display area, wherein the common voltage portion is connected to the second electrode, the common voltage portion is disposed on a layer that is different from the second electrode, and the common voltage portion is disposed below a lowermost portion of the second electrode;
 an encapsulation portion disposed in the display area and the non-display area, wherein the encapsulation portion covers the organic light emitting diode; and
 a touch sensor disposed on the encapsulation portion, wherein the touch sensor comprises a touch portion disposed in the display area, and a connection wire disposed in the non-display area and connected to the touch portion, wherein the connection wire overlaps the common voltage portion.

2. The OLED display of claim 1, wherein the connection wire comprises a plurality of connection lines disposed between an edge of the substrate and the display area,
wherein at least one connection line from among the plurality of connection lines disposed adjacent to the edge of the substrate does not overlap the common voltage portion.

3. The OLED display of claim 1, further comprising:
a driving circuit portion disposed in the non-display area and connected to the pixel circuit portion,
wherein the common voltage portion is disposed between the pixel circuit portion and the driving circuit portion.

4. The OLED display of claim 3, wherein the driving circuit portion is adjacent to an edge of the substrate.

5. The OLED display of claim 3, further comprising:
a scan wire that connects the driving circuit portion and the pixel circuit portion; and
a data wire that crosses the scan wire and is connected to the pixel circuit portion.

6. The OLED display of claim 1, further comprising:
an organic emission layer disposed between the first electrode and the second electrode.

7. The OLED display of claim 6, wherein the connection wire does not overlap the second electrode.

8. The OLED display of claim 6, further comprising:
a connection portion that directly connects the common voltage portion and the second electrode,
wherein the connection wire comprises a plurality of connection lines disposed between an edge of the substrate and the display area,
wherein at least one connection line from among the plurality of connection lines disposed adjacent to the edge of the substrate does not overlap the connection portion.

9. The OLED display of claim 8, wherein the connection portion is disposed on a same layer as the first electrode on the substrate.

10. The OLED display of claim 1, wherein the touch sensor contacts the encapsulation portion.

11. The OLED display of claim 10, wherein the encapsulation portion comprises at least one organic layer.

12. The OLED display of claim 11, wherein the encapsulation portion comprises a portion on which the connection wire is disposed, and a thickness of the portion on which the connection wire is disposed gradually decreases from the display area toward an edge of the substrate.

13. The OLED display of claim 12, wherein the connection wire comprises a plurality of connection lines disposed between the edge of the substrate and the display area,
wherein one connection line from among the plurality of connection lines that is closest to the edge of the substrate is closer to an upper surface of the substrate than another connection line from among the plurality of connection lines that is closest to the display area.

14. The OLED display of claim 13, wherein the one connection line does not overlap the common voltage portion.

15. An organic light emitting diode (OLED) display, comprising:
a substrate comprising a display area and a non-display area disposed adjacent to the display area;
an organic light emitting diode disposed in the display area and comprising a first electrode and a second electrode;
a common voltage portion disposed in the non-display area and connected to the second electrode;
an encapsulation portion disposed in the display area and the non-display area, wherein the encapsulation portion covers the organic light emitting diode; and
a touch sensor disposed on the encapsulation portion,
wherein the touch sensor comprises a touch portion disposed in the display area, and a plurality of connection lines disposed in the non-display area and connected to the touch portion,
wherein one connection line from among the plurality of connection lines that is closest to an edge of the substrate is closer to an upper surface of the substrate than another connection line from among the plurality of connection lines that is closest to the display area.

16. The OLED display of claim 15, wherein a surface of the encapsulation portion is curved in the non-display area.

17. The OLED display of claim 16, wherein the surface of the encapsulation portion is substantially flat in the display area.

18. An organic light emitting diode (OLED) display, comprising:
a substrate comprising a display area and a non-display area disposed adjacent to the display area;
an organic light emitting diode disposed in the display area and comprising a first electrode and a second electrode;
a common voltage portion disposed in the non-display area and connected to the second electrode;
a connection portion that connects the common voltage portion and the second electrode;
an encapsulation portion disposed in the display area and the non-display area, wherein the encapsulation portion covers the organic light emitting diode; and
a touch sensor disposed on the encapsulation portion,
wherein the touch sensor comprises a touch portion disposed in the display area, and a connection wire disposed in the non-display area and connected to the touch portion,
wherein the connection wire comprises a plurality of connection lines disposed between an edge of the substrate and the display area,
wherein at least one connection line from among the plurality of connection lines disposed adjacent to the edge of the substrate does not overlap the connection portion.

19. The OLED display of claim 18,
wherein one connection line from among the plurality of connection lines that is closest to the edge of the substrate is closer to an upper surface of the substrate than another connection line from among the plurality of connection lines that is closest to the display area.

20. The OLED display of claim 19, wherein at least one of the connection lines overlaps the common voltage portion, and the one connection line that is closest to the edge of the substrate does not overlap the common voltage portion.

* * * * *